United States Patent
Bai

(10) Patent No.: US 6,822,337 B2
(45) Date of Patent: Nov. 23, 2004

(54) WINDOW-TYPE BALL GRID ARRAY SEMICONDUCTOR PACKAGE

(75) Inventor: Jin-Chuan Bai, Hsinchu (TW)

(73) Assignee: UltraTera Corporation, Hsin-Chu (TW)

( * ) Notice: Subject to any disclaimer, the term of this patent is extended or adjusted under 35 U.S.C. 154(b) by 0 days.

(21) Appl. No.: 10/261,834

(22) Filed: Sep. 30, 2002

(65) Prior Publication Data

US 2004/0061239 A1 Apr. 1, 2004

(51) Int. Cl.[7] .................................................. H01C 23/48
(52) U.S. Cl. ...................... 257/783; 257/774; 257/787; 257/738
(58) Field of Search ................................ 257/773, 774, 257/737, 738, 784, 787, 780, 783

(56) References Cited

U.S. PATENT DOCUMENTS 6,445,077 B1 * 9/2002 Choi et al. .................. 257/786
2002/0180035 A1 * 12/2002 Huang et al. ............... 257/706
2002/0190366 A1 * 12/2002 Hung et al. ................. 257/684

* cited by examiner

Primary Examiner—Nathan J. Flynn
Assistant Examiner—Pershelle Greene
(74) Attorney, Agent, or Firm—Fulbright & Jaworski LLP

(57) ABSTRACT

A window-type ball grid array (WBGA) semiconductor package is proposed. A substrate is formed with an opening and a tape attach area around the opening. A polyimide tape having an aperture is applied over the tape attach area, allowing the aperture to be aligned with the opening of the substrate. A chip is mounted over the polyimide tape and electrically connected to the substrate via the opening by bonding wires, wherein the polyimide tape is interposed between the chip and the substrate so as not to leave any gaps between the chip and the substrate. A first encapsulant is formed to fill the opening and encapsulate the bonding wires. A second encapsulant is fabricated to encapsulate the chip. With no gaps between the chip and the substrate, the chip is firmly supported on the substrate during a molding process for fabricating the second encapsulant, thereby preventing chip cracks from occurrence.

12 Claims, 7 Drawing Sheets

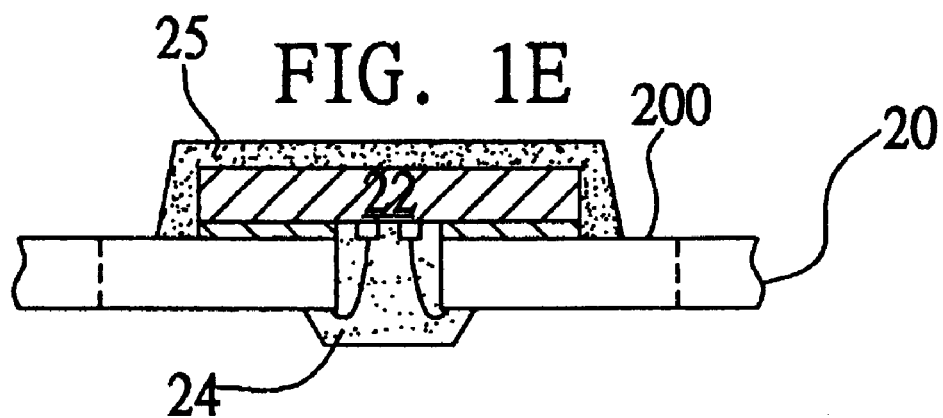
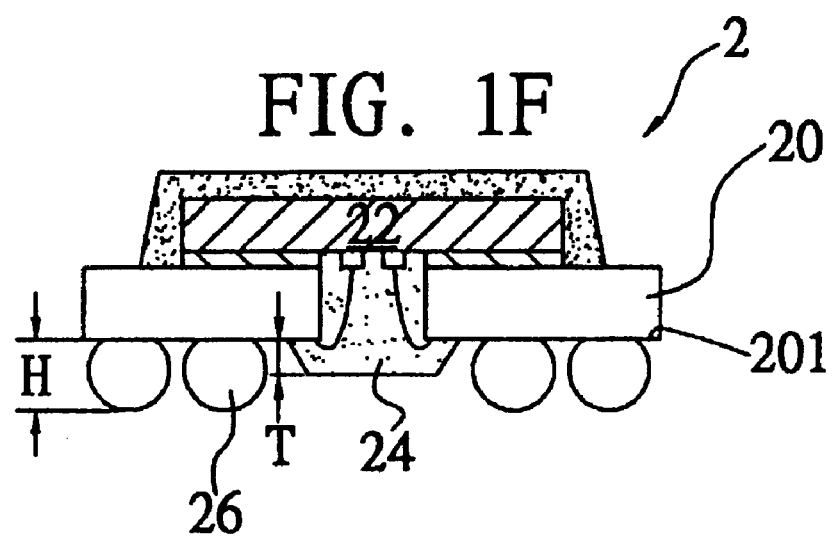

US 6,822,337 B2

WINDOW-TYPE BALL GRID ARRAY SEMICONDUCTOR PACKAGE

FIELD OF THE INVENTION

The present invention relates to semiconductor packages, and more particularly, to a window-type ball grid array (WBGA) semiconductor package with a chip being mounted over an opening formed through a substrate and electrically connected to the substrate via the opening by bonding wires.

BACKGROUND OF THE INVENTION

Window-type semiconductor packages are advanced packaging technology, characterized by forming at least an opening penetrating through a substrate, allowing a chip to be mounted over the opening, and electrically connected to the substrate by bonding wires through the opening. One benefit achieved by this window-type package structure is to shorten length of the bonding wires, and thus make electrical transmission or performances between the chip and the substrate more efficiently implemented.

A conventional window-type ball grid array (WBGA) semiconductor package 1 is exemplified with reference to FIGS. 3 and 4A–4C. As shown in FIGS. 3 and 4A, this WBGA semiconductor package 1 is composed of a substrate 10 formed with an opening 100 penetrating through the same; a chip 11 mounted over the opening 100 on an upper surface 101 of the substrate 10 by means of an adhesive 12 in a face-down manner that, an active surface 110 of the chip 11 faces toward the substrate 10 and is partly exposed to the opening 100; a plurality of bonding wires 13 formed through the opening 100 for electrically connecting the active surface 110 of the chip 11 to a lower surface 102 of the substrate 10; a first encapsulant 14 formed on the lower surface 102 of the substrate 10 for filling the opening 100 and encapsulating the bonding wires 13; a second encapsulant 15 formed on the upper surface 101 of the substrate 10 for encapsulating the chip 11, and a plurality of solder balls 16 implanted on the lower surface 102 of the substrate 10 and situated outside the first encapsulant 14

The above conventional WBGA package I has significant drawbacks. As shown in FIGS. 3, 4B and 4C, gaps G may undesirably exist between the active surface 110 of the chip 11 and the upper surface 101 of the substrate 10 at area uncovered by the adhesive 12 and adjacent to the opening 100 of the substrate 10, for example, along two relatively shorter sides of the opening 100 (as shown in FIG. 3). During a molding process for fabricating the second encapsulant 15 on the upper surface 101 of the substrate 10, the chip 11 at positions corresponding to the adhesive-uncovered gaps G lacks for mechanical support from the substrate 10 and thus leads to chip-cracking in response to impact or force generated during molding, which would thereby adversely affects reliability and yield of fabricated package products.

Therefore, the problem to be solved herein is to provide a semiconductor package for allowing a chip to be well supported on a substrate during a molding process for encapsulating the chip, so as to prevent chip cracks from occurrence.

SUMMARY OF THE INVENTION

A primary objective of the present invention is to provide a window-type ball grid array (WBGA) semiconductor package, which allows a chip to be firmly supported on a substrate so as to prevent chip cracks during a molding process for encapsulating the chip, thereby assuring reliability and yield of fabricated package products.

In accordance with the above and other objectives, the present invention proposes a WBGA semiconductor package, comprising: a substrate having an upper surface and a lower surface opposed to the upper surface, and formed with at least an opening penetrating through the upper and lower surfaces, wherein a tape attach area is defined on the upper surface of the substrate peripherally around the opening; an adhesive tape (such as a polyimide film) formed with an aperture corresponding in position to the opening of the substrate, and applied over the tape attach area in a manner as to align the aperture of the adhesive tape with the opening of the substrate; at least a chip having an active surface and a non-active surface opposed to the active surface, and mounted over the adhesive tape in a manner that, a conductive area on the active surface of the chip is exposed to the opening of the substrate and the aperture of the adhesive tape, and the adhesive tape is interposed between the active surface of the chip and the upper surface of the substrate to be free of forming gaps between the chip and the substrate; a plurality of bonding wires formed through the opening of the substrate and the aperture of the adhesive tape, so as to electrically connect the conductive area on the active surface of the chip to the lower surface of the substrate by means of the bonding wires; a first encapsulant formed on the lower surface of the substrate for encapsulating the bonding wires and for filling the opening of the substrate and the aperture of the adhesive tape; a second encapsulant formed on the upper surface of the substrate for encapsulating the chip; and a plurality of solder balls implanted on the lower surface of the substrate at area outside the first encapsulant.

The above package structure provides significant benefits. With no gaps being left between the chip and the substrate through the use of the adhesive tape, the chip can be well held in position on the substrate. During the molding process for fabricating the second encapsulant that encapsulates the chip, the adhesive tape and the first encapsulant respectively formed on the upper and lower surfaces of the substrate, can therefore assure the chip to be firmly supported on the substrate without causing cracks of the chip. As compared to the prior art with unsealed gaps between a chip and a substrate uncovered by an adhesive and adjacent to an opening of the substrate and thus inducing chip-cracking, the adhesive tape used in this invention for perfectly adhering the chip to the substrate in a gap-free manner may desirably assure structural intactness of the chip and thus improve reliability and yield of fabricated package products. Moreover, application of the adhesive tape for chip-substrate attachment is relatively simple to implement, which thereby reduces process complexity and fabrication costs for the package structure.

BRIEF DESCRIPTION OF THE DRAWINGS

The present invention can be more fully understood by reading the following detailed description of the preferred embodiments, with reference made to the accompanying drawings, wherein:

FIGS. 1A–1F are schematic diagrams showing fabrication processes for a semiconductor package according to a preferred embodiment of the invention.

DETAILED DESCRIPTION OF THE PREFERRED EMBODIMENTS

Preferred embodiments for a window-type ball grid array (WBGA) semiconductor package proposed in the present invention are described in more detail as follows with reference to FIGS. 1A–1F and 2

Figure 1A:
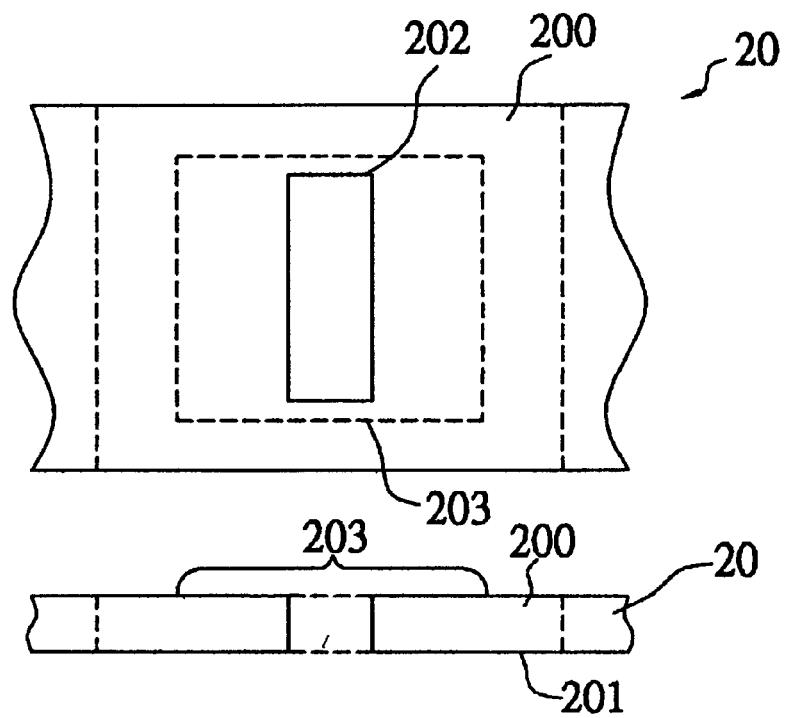
Figure 1B:
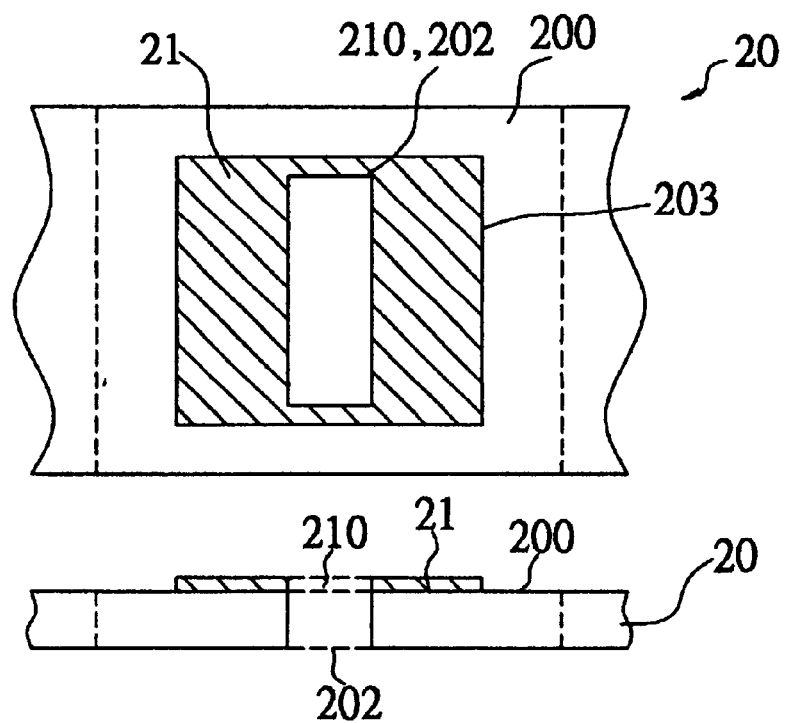

FIGS. 1A–1F illustrate fabrication processes for a WBGA semiconductor package 2 according to a preferred embodiment of the invention. Referring to FIG. 1A, the first step is to prepare a substrate 20 having an upper surface 200 and a lower surface 201 opposed to the upper surface 200 An opening 202 is formed to penetrate through the upper and lower surfaces 200, 201 of the substrate 20, and a tape attach area 203 is defined on the upper surface 200 of the substrate 20 peripherally around the opening 202 The substrate 20 is primarily made of a conventional resin material such as epoxy resin, polyimide, BT resin, FR-4 resin, etc Referring to FIG. 1B, the next step is to prepare an adhesive tape 21 such as a polyimide film formed with an aperture 210 corresponding in position to the opening 202 of the substrate 20, wherein the aperture 210 is equal in dimension to the opening 202. Then, the adhesive tape 21 is applied over the tape attach area 203 on the upper surface 200 of the substrate 20 in a manner that, the aperture 210 of the adhesive tape 21 is aligned with the opening 202 of the substrate 20

Figure 1C:
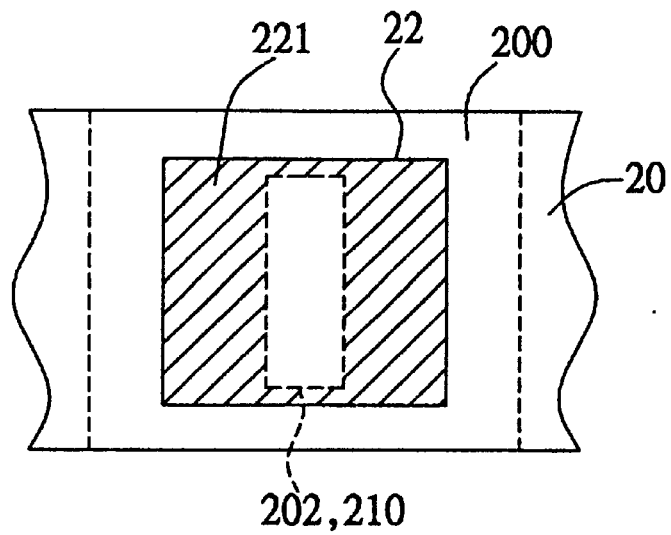
Figure 1C:
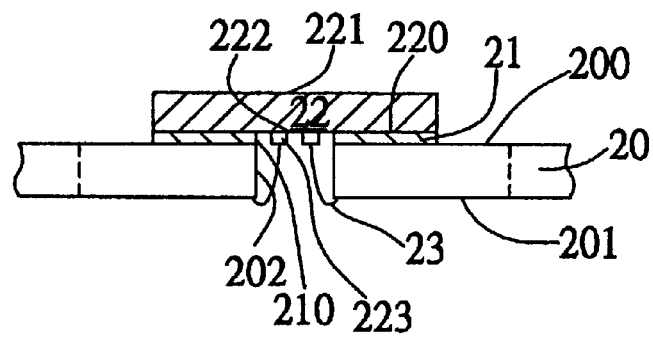

Referring to FIG. 1C, a chip 22 is prepared, having an active surface 220 where electronic elements and circuits are formed, and a non-active surface 221 opposed to the active surface 220. The chip 22 is mounted over the adhesive tape 21 on the upper surface 200 of the substrate 20 in a face-down manner that, a conductive area 222 on the active surface 220 of the chip 22 is exposed to the opening 202 of the substrate 20 and the aperture 210 of the adhesive tape 21, so as to allow a plurality of bond pads 223 formed on the conductive area 222 to be exposed for proceeding with a subsequent wire-bonding process. And, the adhesive tape 21 is interposed between the active surface 220 of the chip 22 and the upper surface 200 of the substrate 20 in a manner as not to leave any gaps between the chip 22 and the substrate 20.

Then, a wire-bonding process is performed to form a plurality of bonding wires 23 e.g. gold wires through the opening 202 of the substrate 20 and the aperture 210 of the adhesive tape 21. With the bonding wires 23 being bonded to the exposed bond pads 223 on the conductive area 222 of the chip 22, the active surface 220 of the chip 22 can thus be electrically connected to the lower surface 201 of the substrate 20 by means of the bonding wires 23.

Figure 1D:
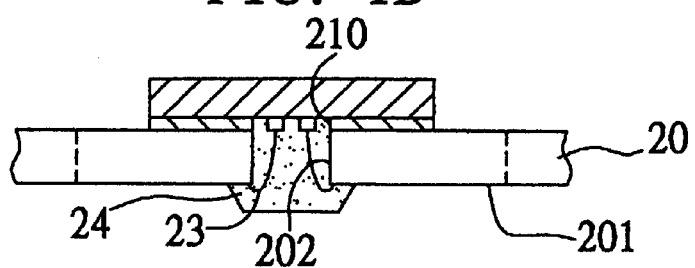

Referring to FIG. 1D, a printing process is performed to form a first encapsulant 24 on the lower surface 201 of the substrate 20. The first encapsulant 24 is adapted to encapsulate the bonding wires 23 and to fill the opening 202 of the substrate 20 and the aperture 210 of the adhesive tape 21.

Referring to FIG. 1E, a molding process is performed to form a second encapsulant 25 on the upper surface 200 of the substrate 20 for encapsulating the chip 22 The second encapsulant 25 may be made of a resin material different from that for fabricating the first encapsulant 24.

Referring to FIG. 1F, a plurality of solder balls 26 are implanted on the lower surface 201 of the substrate 20 at area outside the first encapsulant 24. And, height H of the solder balls 26 is greater than thickness T of the first encapsulant 24 protruding from the lower surface 201 of the substrate 20. The solder balls 26 serve as I/O (input/output) ports of the semiconductor package 2 for electrically connecting the chip 22 to an external device such as a printed circuit board (not shown).

Figure 2:
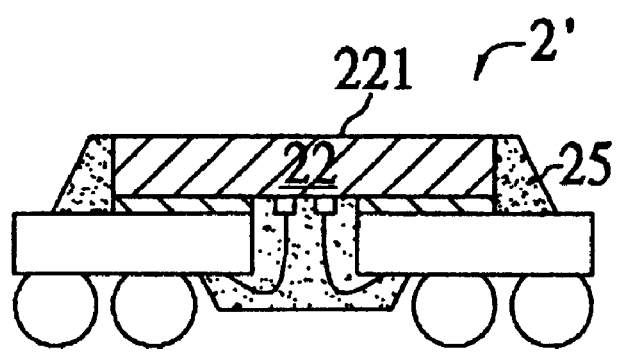
FIG. 2 is a cross-sectional view of the semiconductor package according to another preferred embodiment of the invention, FIG. 3 (PRIOR ART) is a top view of a conventional semiconductor package, and FIGS. 4A, 4B and 4C (PRIOR ART) are cross-sectional views of the semiconductor package shown in FIG. 3 respectively taken along lines 4A—4A, 4B—4B and 4C—4C.
Figure 3:
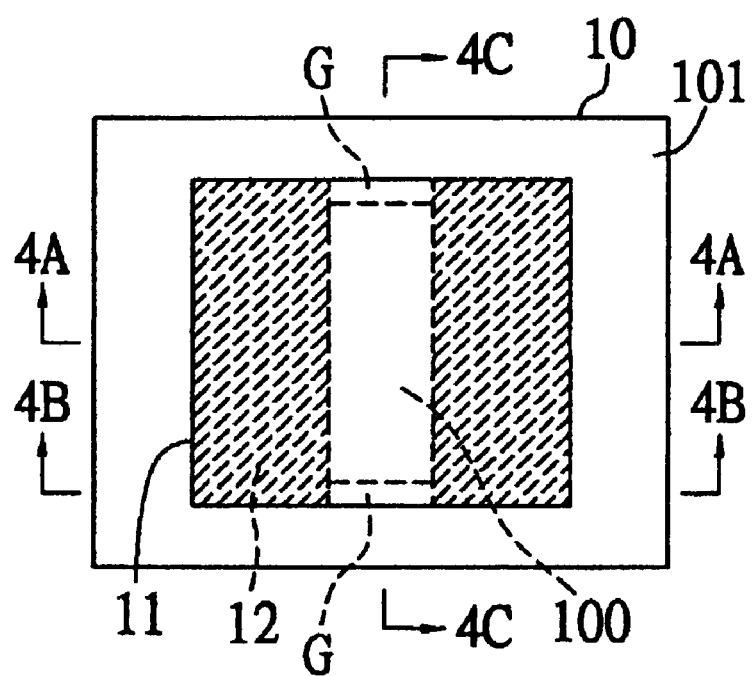
Figure 4A:
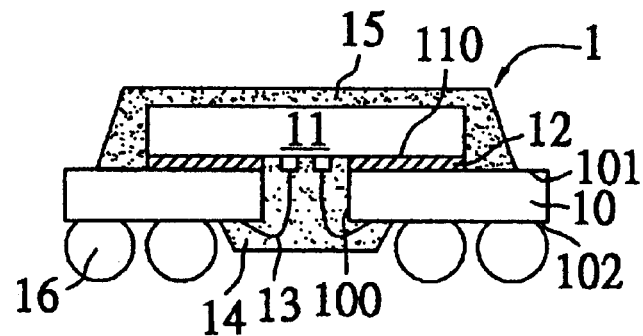
Figure 4B:
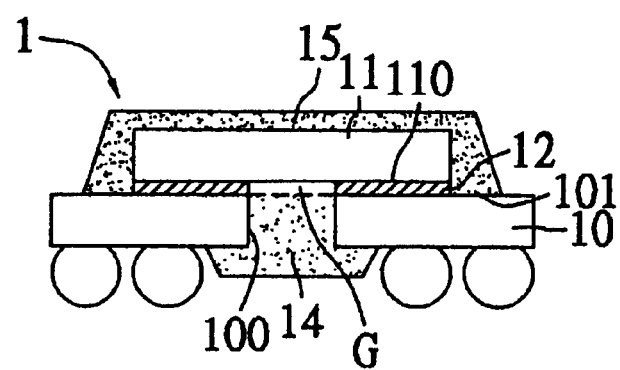
Figure 4C:
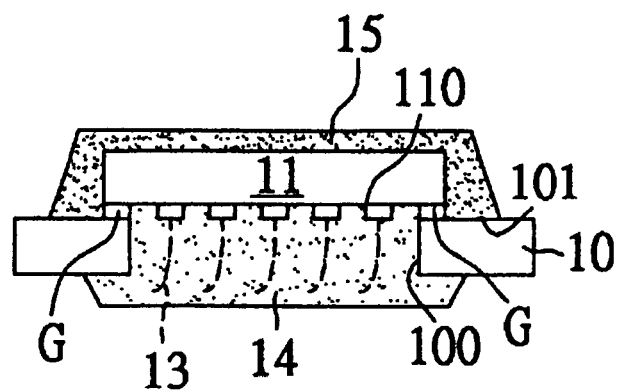

FIG. 2 illustrates a semiconductor package 2' according to another preferred embodiment of the invention. This semiconductor package 2' is primarily the same as the semiconductor package 2 of the above embodiment, and only differs from the above semiconductor package 2 in that, the non-active surface 221 of the chip 22 in this semiconductor package 2' is exposed to outside of the second encapsulant 25 that encapsulates the chip 22. This structural arrangement facilitates dissipation of heat generated from operation of the chip 22 via the exposed non-active surface 221 of the chip 22, thereby improving heat dissipating efficiency of the semiconductor package 2'.

The above semiconductor package 2, 2' provides significant benefits. With no gaps being left between the chip 22 and the substrate 20 through the use of the adhesive tape 21, the chip 22 can be well held in position on the substrate 20. During the molding process for fabricating the second encapsulant 25 that encapsulates the chip 22, the adhesive tape 21 and the first encapsulant 24 respectively formed on the upper and lower surfaces 200, 201 of the substrate 20, can therefore assure the chip 22 to be firmly supported on the substrate 20 without causing cracks of the chip 22. As compared to the prior art with unsealed gaps between a chip and a substrate uncovered by an adhesive and adjacent to an opening of the substrate and thus inducing chip-cracking, the adhesive tape 21 used in this invention for perfectly adhering the chip 22 to the substrate 20 in a gap-free manner may desirably assure structural intactness of the chip 22 and thus improve reliability and yield of fabricated package products. Moreover, application of the adhesive tape 21 for chip-substrate attachment is relatively simple to implement, which thereby helps reduce process complexity and fabrication costs for the semiconductor package 2, 2'.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A window-type semiconductor package, comprising:
   a substrate having an upper surface and a lower surface opposed to the upper surface, and formed with at least an opening penetrating through the upper and lower surfaces, wherein a tape attach area is defined on the upper surface of the substrate peripherally around the opening;
   an adhesive tape formed with an aperture corresponding in position to the opening of the substrate, and applied over the tape attach area and around the opening in a manner as to align the aperture of the adhesive tape with the opening of the substrate;
   at least a chip having an active surface and a non-active surface opposed to the active surface and mounted over the adhesive tape, wherein the active surface is larger than and completely covers the aperture and the opening, allowing a conductive area on the active surface of the chip to be exposed to the opening of the substrate and the aperture of the adhesive tape, and the adhesive tape is interposed between the active surface of the chip and the upper surface of the substrate such that the active surface of the chip, exclusive of the conductive area, is completely covered by the adhesive tape to be free of forming gaps between the chip and the substrate;

a plurality of bonding wires formed through the opening of the substrate and the aperture of the adhesive tape, so as to electrically connect the conductive area on the active surface of the chip to the lower surface of the substrate by means of the bonding wires;

a first encapsulant formed on the lower surface of the substrate for encapsulating the bonding wires and for filling the opening of the substrate and the aperture of the adhesive tape;

a second encapsulant formed on the upper surface of the substrate for encapsulating the chip; and a plurality of solder balls implanted on the lower surface of the substrate at an area outside the first encapsulant.

2. The semiconductor package of claim 1, wherein the adhesive tape is made of polyimide.

3. The semiconductor package of claim 1, wherein the aperture of the adhesive tape is equal in dimension to the opening of the substrate.

4. The semiconductor package of claim 1, wherein with no gaps being left between the chip and the substrate, the chip is firmly supported on the substrate when the second encapsulant is formed for encapsulating the chip, so as to prevent chip cracks from occurrence.

5. The semiconductor package of claim 1, wherein the chip is formed with a plurality of bond pads on the conductive area of the active surface thereof, allowing the bond pads to be exposed via the opening of the substrate and the aperture of the adhesive tape.

6. The semiconductor package of claim 5, wherein the bonding wires are bonded to the exposed bond pads of the chip.

7. The semiconductor package of claim 1, wherein the chip is dimensioned to completely cover the opening of the substrate and the aperture of the adhesive tape.

8. The semiconductor package of claim 1, wherein the first encapsulant is printed on the lower surface of the substrate.

9. The semiconductor package of claim 1, wherein the second encapsulant is molded on the upper surface of the substrate.

10. The semiconductor package of claim 1, wherein the first and second encapsulants are made of different materials.

11. The semiconductor package of claim 1, wherein the non-active surface of the chip is exposed to outside of the second encapsulant.

12. The semiconductor package of claim 1, wherein the height of the solder balls is greater than the thickness of the first encapsulant protruding from the lower surface of the substrate.

* * * * *